(12) United States Patent
Husher et al.

(10) Patent No.: US 6,566,733 B1
(45) Date of Patent: May 20, 2003

(54) METHOD AND SYSTEM FOR PROVIDING A POWER LATERAL PNP TRANSISTOR USING A BURIED POWER BUSS

(75) Inventors: John Durbin Husher, Santa Clara, CA (US); Ronald L. Schlupp, Santa Clara, CA (US)

(73) Assignee: Micrel, Inc., San Jose, CA (US)

(*) Notice: Subject to any disclaimer, the term of this patent is extended or adjusted under 35 U.S.C. 154(b) by 0 days.

(21) Appl. No.: 10/176,285

(22) Filed: Jun. 19, 2002

(51) Int. Cl.$^7$ .................................................. A01L 29/00
(52) U.S. Cl. ...................... 257/557; 257/560; 257/423; 257/559; 257/197; 257/565; 257/556
(58) Field of Search ................................ 257/557, 556, 257/559, 197, 565, 560, 423

(56) References Cited

U.S. PATENT DOCUMENTS 4,749,661 A * 6/1988 Bower ........................ 438/345

* cited by examiner

Primary Examiner—Sara Crane
Assistant Examiner—Junghwa Im
(74) Attorney, Agent, or Firm—Sawyer Law Group LLP

(57) ABSTRACT

A power lateral PNP device is disclosed which includes an epitaxial layer; a first and second collector region embedded in the epitaxial layer; an emitter region between the first and second collector regions. Therefore slots are placed in each of the regions. Accordingly, in a first approach the standard process flow will be followed until reaching the point where contact openings and metal are to be processed. In this approach slots are etched that are preferably 5 to 6 um deep and 5 to 6 um wide. These slots are then oxidized and will be subsequently metalized. When used for making metal contacts to the buried layer or for ground the oxide is removed from the bottom of the slots by an anisotropic etch. Subsequently when these slots receive metal they will provide contacts to the buried layer where this is desired and to the substrate when a ground is desired. In a second approach the above-identified process is completed up through the slot process without processing the lateral PNPs. With a separate masking and etching the oxide is removed from the PNP slots and boron is deposited in a diffusion furnace and driven in a non oxidizing atmosphere.

10 Claims, 12 Drawing Sheets

METAL IN SLOTS

STANDARD APPROACH

FIG. 1

IDEAL STRUCTURE

SLOTS AFTER DIFFUSION

CVD METAL - CONFORMAL

METAL IN SLOTS

SLOTS AFTER DIFFUSION

FIG. 6C

DIFFUSION AFTER SLOTS

FIG. 7A

FIG. 7B  Base contact in remote slot to Epi and/or buried layer

DIFFUSION BEFORE SLOTS

FIG. 9A

DIFFUSION BEFORE SLOTS

METHOD AND SYSTEM FOR PROVIDING A POWER LATERAL PNP TRANSISTOR USING A BURIED POWER BUSS

CROSS-RELATED APPLICATION

The present application is related to application Serial No. 10/176,220 (2366P) entitled "Method and System for Providing a Power Lateral PNP Transistor Using a Buried Power Buss."

FIELD OF THE INVENTION

The present invention relates specifically to high current semiconductor devices and more particularly to a power lateral PNP device using a buried power buss.

BACKGROUND OF THE INVENTION

Figure 1:
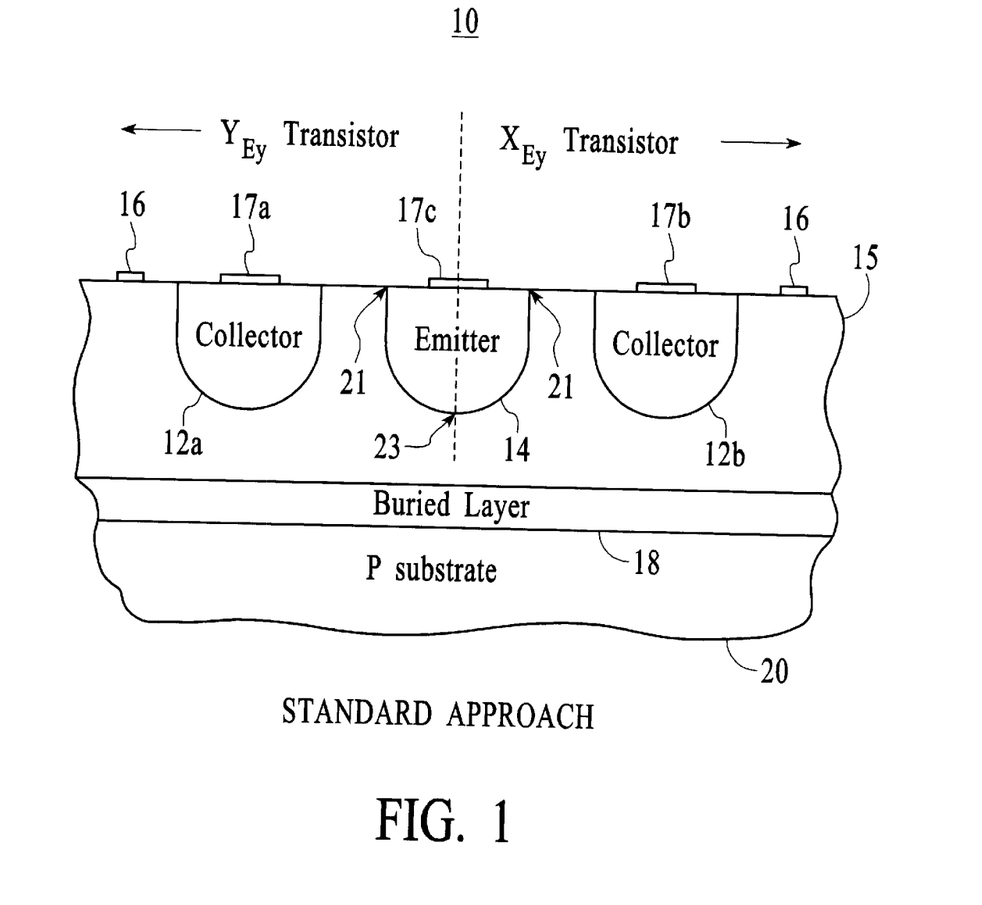
FIG. 1 illustrates a cross-section of a standard deep diffused PNP/standard IC lateral PNP.

Lateral PNP transistors are utilized extensively in high power applications. They are typically deeply diffused devices that carry very high current (1–5 amps or higher). FIG. 1 shows a cross-section of a standard deep diffused PNP device 10. The emitter 14 is the inside electrode. As shown, this can represent a bulls-eye pattern with the emitter as the bulls-eye and the collector surrounding it, or double collector lines adjacent to each side of an emitter. The device 10 includes two P+ collectors 12a and 12b and P+ emitter 14 between. The two P+ collectors 12a, 12b and the P+ emitter 14 are diffused in an N epitaxial layer 15. An N+ layer 18 (the buried layer) is deposited in a P− substrate 20 which is coupled to the N epitaxial layer 15. An N+ base contact 16 is coupled to the surface of the N epitaxial layer 15 and coupled electrically via the N+ buried layer to apply a voltage between the N base and the P+ emitter 14. The collectors 12a and 12b include a metal layer 12a and 12b respectively on the surface thereof. The collectors TCF 12a and 12b are outside circular electrodes when a bulls-eye pattern is used and are parallel separate structures when parallel inline design is used. The base 16 is contacted via a metalized N diffusion that is placed in the N epitaxial layer 15. For some applications it is tied to the N+ buried layer.

Injection from the emitter 14 is from the total outside periphery of the emitter for the total depth of the emitter. This results in a tremendous difference in the base widths since the surface portion of the emitter 12 is closest to the edge of the surface of the collectors and therefore has the shortest base width. Moving down the periphery of the emitter 12a and 12b, the base width becomes longer and longer and reaches its maximum base width at the deepest point 23.

Referring back to FIG. 1, it is obvious that most of the injection and collection could be considered coming from two transistors in parallel. Transistor XR being on the right half of the emitter and its injection being collected by transistor XR. While at the same time transistor YL on the left half of the emitter has its injection being collected by YL, the collector on the left side. To give some general quantitative idea of the basewidths, assume that the distance from the emitter to collector is 8 μm on the mask. If, for example, the P diffusions are 2.5 μm deep and the side diffusion is 2.0 μm around the total periphery of the emitter and collector, then this leaves the basewidth approximately 4 μm long at the surface and approximately 8 μm long from point 23. In fact, these effective basewidths are much less due to the depletion region extending from the collectors into the base region 16 (N epitaxial layer) and the depletion region of the emitters extending into the base region 16 (N epitaxial layer). This particular example may not be able to work at very high voltages due to punch-through. It is very easy to have depletion widths of a micron or more. This leaves the surface with a basewidth of approximately 2 μm and the basewidth of the bottom of approximately 6 μm.

Without surface effects, this means the surface portion of these two transistors in parallel have the highest beta and the best frequency response, while the deep points have the lowest beta and the worst frequency response.

In general, the beta coming from the bottom point 23 of these transistors can be ignored. Beta is much lower than is achieved at the surface mainly limited by recombination in the bulk as well as the fact that the base emitter voltage ($V_{be}$) is somewhat less at the bottom due to some additional drop from the base contact to the actual base. Likewise, it can be assumed that some of the surface beta is lost due to surface recombination velocity. It can then be assumed that the beta is the average beta with a base width of approximately 3 μm. However, beta is a function of the amount of current collected versus the amount of current emitted. The current being emitted is along the total periphery of the two transistors in parallel as determined by the base emitter voltage ($V_{be}$) and the resultant low base current. The current being collected as a result of this emission is much less due to the issues just discussed, therefore resulting in a beta that is much lower.

The frequency response of the standard lateral PNP is determined by the worse response of the structure. This means the bottom of the radial structure is determining the frequency response of the device due to its long basewidth. Frequency response is determined by where the output is down to 0.707 of the low frequency output. At low frequency the current, and therefore the beta is made up of all the varying basewidths from top to bottom of the structure.

As the frequency increases the bottom of the structure with the long basewidth has recombination occurring on the long basewidths and the output current for a given input current goes down. This shows the total structure as having a lower output current as the frequency increases. The long basewidth device is therefore determining when the overall output is down to 0.707 of the low frequency output. For a power lateral PNP device, where frequency response may not be an issue this is of secondary concern; gain is the primary concern.

Another issue with the standard approach relates to debiasing of the emitter when carrying high current. This occurs because metal is on top of the emitter and therefore the maximum voltage is applied on the surface and the voltage drops to lower values as one goes along the depth of the emitter due to drops in the resistance of the emitter. This drop can be very high since the current may run 1 amp to greater than 5 amps and any amount of resistance will result in significant debiasing.

Figure 2:
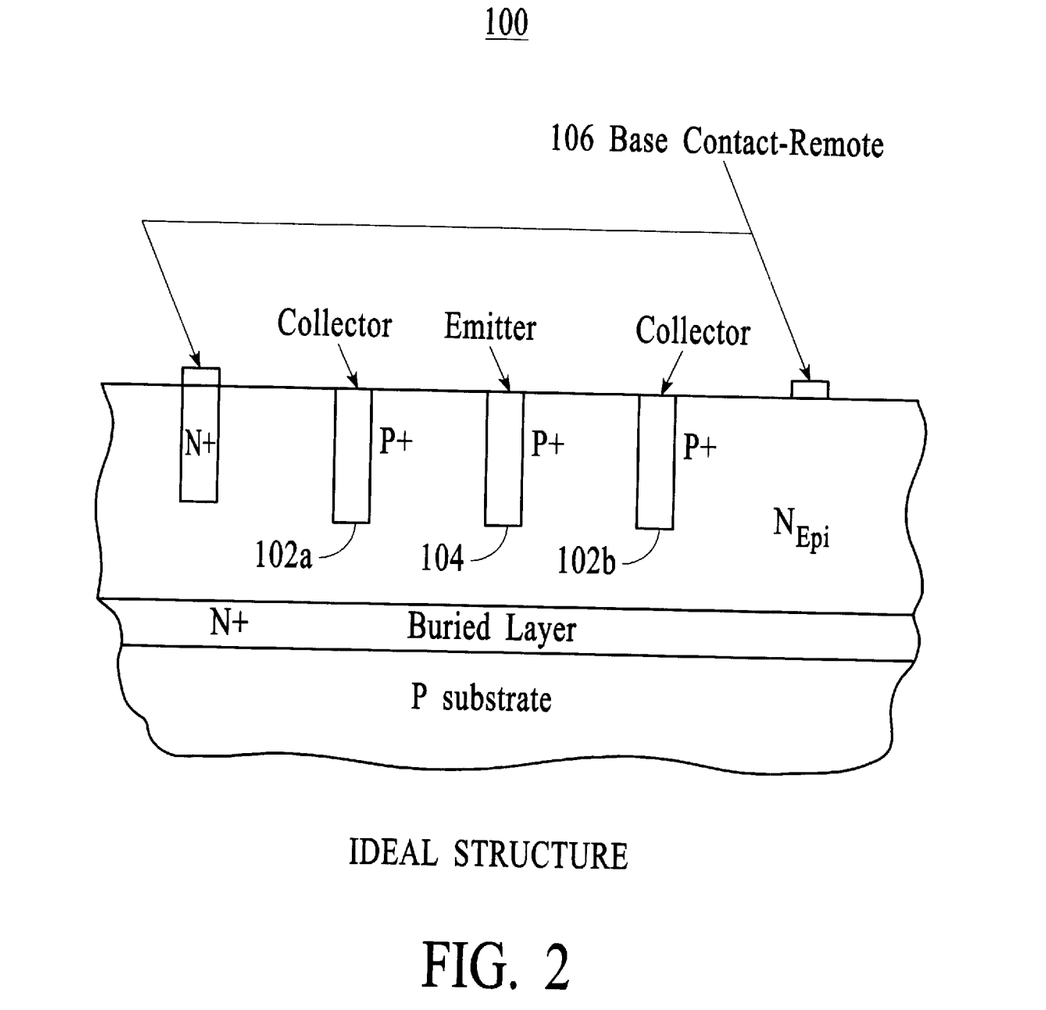
FIG. 2 illustrates an ideal lateral PNP.

An ideal lateral PNP would have a profile as shown in FIG. 2, where the emitter and collectors are vertical spikes that have the same basewidth from top to bottom. It would also have metal the full depth to reduce debiasing.

Accordingly, what is needed is a system and method for providing a power lateral PNP is that approaches this ideal structure. This lateral PNP would have an improved beta and frequency response. The present invention addresses such a need with two approaches.

SUMMARY OF THE INVENTION

A power lateral PNP device is disclosed which includes an epitaxial layer; a first and second collector region embedded in the epitaxial layer; an emitter region between the first and second collector regions. Therefore slots are placed in each of the regions. Accordingly, in a first approach the standard process flow will be followed until reaching the point where contact openings and metal are to be processed. In this approach slots are etched that are preferably 5 μm to 6 μm deep and 5 to 6 μm wide. These depths are examples. They can be changed for different thicknesses of epitaxial material or for different junction depths in the given technology. These slots are then oxidized either thermally or by deposition of an oxide or dielectric layer and will be subsequently metalized. When used for making metal contacts to the buried layer or for ground the oxide is removed from the bottom of these particular slots by an anisotropic etch. Subsequently when these slots receive metal they will provide contacts to the buried layer where this is desired and to the substrate when a ground is desired.

In a second approach the above-identified process is completed up through the slot process without processing the lateral PNPs. With a separate masking and etching, the oxide is removed from the PNP slots and boron is deposited in a diffusion furnace and driven in a non-oxidizing atmosphere.

DETAILED DESCRIPTION

The present invention relates generally to high current semiconductor devices and more particularly to a power lateral PNP device using a buried power buss. However, the technique is advantageous to all uses of a lateral PNP device since it results in major advantages in die size reduction, reduction of Ron, improved frequency response and higher gain. Two approaches will be discussed as part of this invention. There are advantages to both approaches depending on the use of the Lateral PNP in the circuit application and the structure of the total device where the lateral PNP is being used.

The discussion will center around the lateral PNP but it is important to realize that the lateral PNP as described is used in BiCMOS, Bipolar, DMOS, LDMOS, CMOS, and any technology where a lateral PNP will be used. The details of the processing for these technologies will not be covered and is assumed known. So, discussion will jump from starting material, buried layer, epitaxial, and then jump to the lateral PNP which is contained in these various technologies. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

FIG. 2 shows a cross-section of an ideal lateral PNP device 100.

A much higher beta could be achieved if the following existed:

1. The emitter 104 looked more like a vertical stripe facing the collector as shown in FIG. 2.

2. The collector 106 looked more like a vertical stripe as shown in FIG. 2.

3. Surface recombination velocity effects were reduced.

4. The voltage base to emitter ($V_{be}$), which determines the base current and the bias across the total emitter results in equal bias along the total emitter depth.

With this type of device the basewidth of the top or the bottom of the emitter structure would be the same. Emission would be along the total emitter periphery and depth; and, assuming a narrow basewidth from emitter to collector, collection would be high.

In addition, if a structure were made as shown in FIG. 2, there would be a much higher frequency response since the basewidth would be less drastically affected along the whole structure depth and width, and would more closely follow the basewidth normally obtained at the surface where the basewidth is the narrowest. Heretofore such a device was not possible utilizing conventional processing technologies.

U.S. patent application Ser. No. 10/034/184, entitled "Buried Power Buss for High Current, High Power Semiconductor Devices and a Method for Providing the Same," filed in Dec. 28, 2001, and assigned to the assignee of the present application, describes a method and system for providing an interconnect on a semiconductor device. The application is incorporated in its entirety herein. The method and system comprises providing a semiconductor substrate with a plurality of device structures thereon and providing at least one slot in the semiconductor substrate. The method and system include providing a metal within the at least one slot.

This first metal in a preferred embodiment consists of three depositions of metal when sputtered, with the first two depositions being buried in the silicon prior to a dielectric and a third deposition of what is called the first metal layer. This third deposition provides the normal interconnect pattern as it normally is patterned in standard metalization schemes. One therefore has the same metal thickness to etch for the interconnects but approximately three times this thickness in the slots.

This interconnect scheme is utilized to advantage to provide a power lateral PNP device which has improved performance. To describe these features of lateral PNP device in accordance with the present invention, refer now to the following discussion in conjunction with the accompanying figures.

Two embodiments for lateral PNP devices are described herein. The first embodiment describes a lateral PNP device which provides improved beta and frequency response as well as other advantages which will be covered. The second embodiment includes those advantages and also reduces the effect of debiasing of the emitters of the device.

First Embodiment: Power Lateral PNP Using the Buried Power Buss

First the normal processing steps for providing the power lateral PNP device are performed. Fabrication of the power lateral PNP would follow the normal processing that is carried on to produce the PNP device. This process flow will be followed until reaching the point where the contacts are to be made prior to metal.

At this point, slots are etched that are 5 $\mu$m to 6 $\mu$m deep and 5–6 $\mu$m wide (for this example). These slots are then oxidized. For slots which are intended to make contact to the buried layer or to the substrate for ground, the oxide is removed at the bottom of the slots using an anisotropic dry etch. The slots for power buss retain the oxide.

Figure 3:
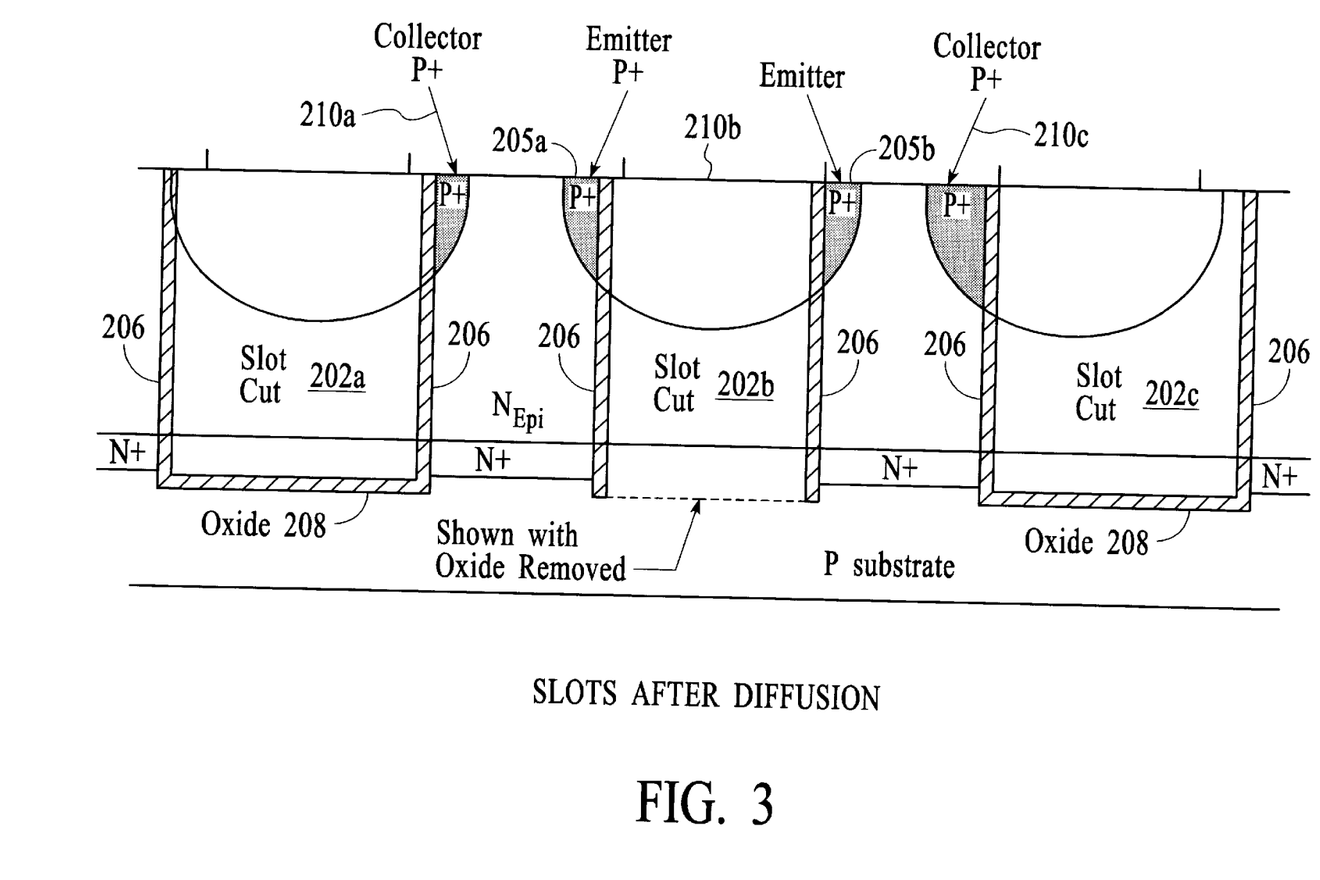
FIG. 3 illustrates slotted and oxidized lateral PNP slots.

FIG. 3 illustrates the PNP 200 device after the slots 202a, 202b and 202c have been cut simultaneously for the collector, emitter and collector respectively. A review of FIG. 3 shows that the slots (or circular tubes in the bulls-eye approach) are made to cut down through the emitter in the middle, separating the emitter into two separate emitter structures 205a and 205b (physically for the inline structure and theoretically for the bulls-eye structure). This emitter slot 202b will have the bottom oxide 208 removed where one desires that the emitter 205a and 205b needs to be grounded. In cases where the emitter 202 is not to be grounded, the oxide will be left intact. The oxide is removed wherever it is desired for the P+ to contact the substrate to provide a ground in the circuit. In this manner grounds can be formed wherever they are desired without requiring the metalization to connect grounds. This provides an additional alternative for the designer in his layout since he doesn't need to be concerned about routing the metal from P+ to P+ to provide a ground. The slot 202 is made to be almost as wide as the dimension at the surface. In this manner the emitter structures 205a and 205b now look more like vertical spikes without much curvature since the P+ is from an implanted source and has less side diffusion than the depth (which is now eliminated).

Figure 4:
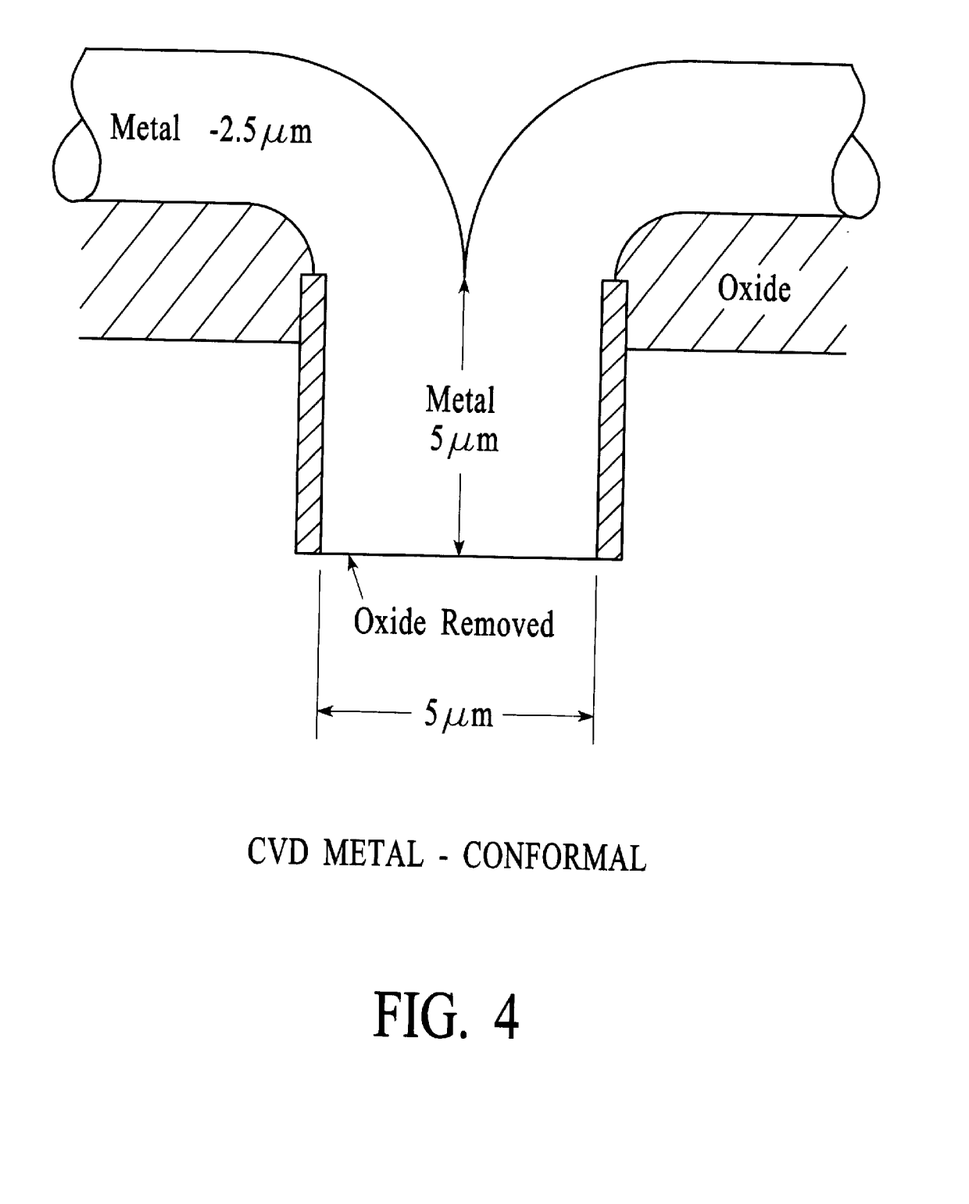
FIG. 4 illustrates 5 μm metal in 5 um slot-conformal CVD metal—metal folds in slot and surface metal is only half the thickness.
Figure 5:
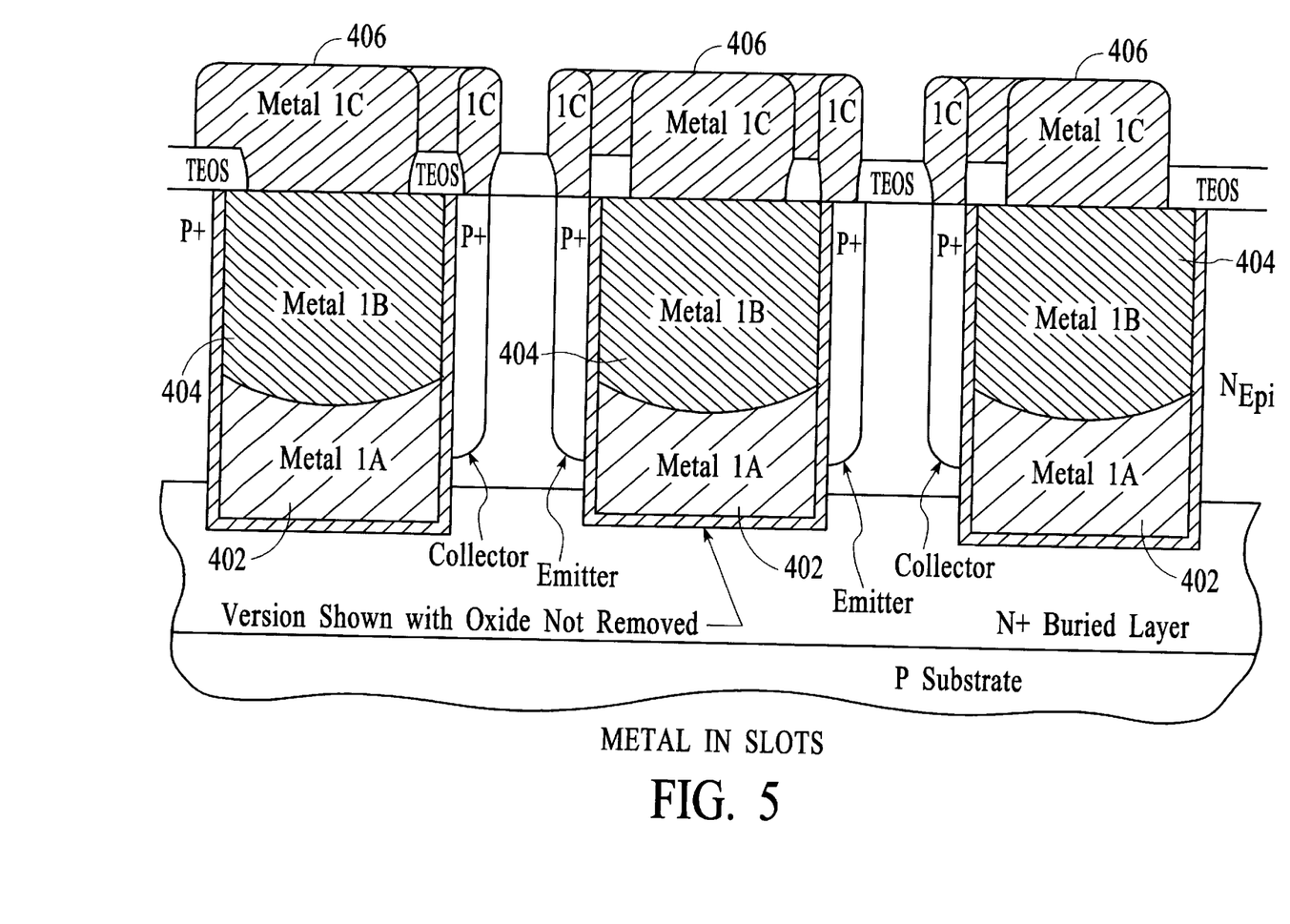
FIG. 5 illustrates metalized-oxide isolated-slots on PNP.

For the lateral PNP, slots are etched as shown in FIG. 3. The slots are etched down through the emitter leaving only the outside edges of the diffusion remaining. Likewise, slots are etched down through the P+ collectors as shown in FIG. 3. This results in only the outside periphery remaining on the emitter and only the inside edges of the collectors (edges facing the emitter). These slots are filled with metal. This is accomplished by CVD metal deposition which conforms to the curvature of the slots. As shown in FIG. 4, the thickness of the metal in the slot is twice the thickness on the surface due to the deposition of the metal "folding" in the slot. This is accomplished by having the slot width being twice the dimension of the metal that is deposited. This provides a major advantage since it lowers the sheet resistance of the metal while allowing the normal thickness to be etched for the interconnects. If CVD metal is not available, the metal is applied in layers as shown in FIG. 5. Layer 1A would be a sputtered metal 2.5 $\mu$m thick. This is followed by a planarization step that removes the surface metal and leaves resist in the slots over metal in the slots. The resist is removed and a second deposition of metal and subsequent processing results in two thickness of metal in the slots and none in the field. A dielectric is deposited such as TEOS and the normal contact openings are then processed, and include the contact etching for contacting the emitter and collectors of the lateral PNP transistor. This approach results in only the outer edges of the emitter and the inner edges of the collectors remaining and they simulate spike diffusions like the ideal lateral PNP.

The slots 202a and 202c for the collectors 210a and 210c are on the outside two thirds of the normal collector as shown in FIG. 3. This allows the remaining inside of the collectors 210a and 210c to look more like vertical spikes since the bottom curvature is removed by the slot and the side curvature is minimal due to the reduced side diffusion of the implanted Boron. The oxide at the bottom of these collectors 210a and 210c could also be removed or remain intact depending on the type of device being manufactured and how one wants to use the lateral PNP.

If the oxide is left it will result in the collectors 210a and 210c not contacting anything below the surface. If it is wanted to make contact to the buried layer, the oxide is removed. If the oxide is removed the collector could make contact to the epitaxial, the substrate ground, or to the N+ buried layer if desired. When it 0.0 is desired for the collectors to make these kinds of contacts, a N+ or P+ implant should be done prior to the oxide removal to ensure a good, non Schottky contact is made.

The base slot is made also in the same manner. In this case the oxide will be removed from the bottom of the slot allowing the base to make contact to the N epitaxial or to the N+ buried layer if desired. In order to ensure a low contact resistance this slot should have an N+ implant prior to removing the oxide. This will result in a low resistance base contact that is buried as it makes contact to the buried layer via the N+ contact and N epitaxial layer.

It should be noted that the discussion to this point assumes the slots are made at the same time as buried power slots are made. This may compromise the specifics desired in the Lateral PNP. If this is the case the slots for the Lateral PNP can be made separately from the buried power slots with one additional mask. This would allow the Lateral PNP Slots to be formed differently than the buried power slots to provide some advantages.

The next step in the process would normally be contact opening followed by the conformal deposition of CVD metal. CVD metal is conformal and would be as shown in FIG. 4. Note that the thickness of metal will be the slot depth as long as the metal is conformal and is one-half the slot width thickness.

Where CVD metal is not available the metal will be deposited by sputter deposition. This metalization is done in three simple steps. FIG. 5 illustrates the power lateral PNP device after the first, second and third metals are provided. Immediately after oxidation of the slots and removal of oxide where needed, a first metal 402 of 2.5 $\mu$m is deposited. This is followed by a resist planarization etch to remove the metal on the surface and then the resist is stripped. This leaves metal of 2.5 $\mu$m in the bottom of the slots. Metal 404 of 2.5 $\mu$m is then deposited followed by a second resist planarization etch and resist strip. This leaves 5.0 $\mu$m of metal 402 and 404 in the slots and none in the field. This is followed by deposition of TEOS. After this, contacts are opened in all the normal contact opening points as well as above the buried power busses that now exist. Another 2.5 $\mu$m of metal 406 is deposited and the metal is patterned as normal. This leaves 7.5 $\mu$m of metal 406 in the grounds, power busses, emitters, collectors and wherever the metal 406 is needed to reduce ohmic drop as well as to prevent de-biasing. If it is desired to go out of an epitaxial tub across ground, the ground only has two layers of metal 402 and 404 with TEOS on top and the metal 406 crosses over. Since metal 406 can be routed anywhere that it is needed without concern for passing over other structures it can be treated like a second metal except for the ground crossovers.

For this reason metal 406 is referred to as metal one point five (1.5) instead of double metal yet it services just as a double metal process serves to provide advantages. The approach of using metal 406 is carried out, however, utilizing only one contact opening. The first contact opening is eliminated, whereas the conventional approach for dual metal requires an extra deposition of dielectric and two contact opening (including the via).

This results in steps such as slots being extra but other steps being eliminated to provide a double metal advantage. This results in reduced masks and reduced processing for a given function. Another advantage exists relative to grounding. Since slots can be placed anywhere one desires a ground and therefore can achieve grounding by using the substrate; metal grounds do not have to be routed on the top surface. This makes designing an IC much easier since routing of ground can be difficult during layout of the design resulting in compromises that increase the size of the die.

Since ground contacts are made anywhere it is desired that a ground slot is to be located, there is no need to be concerned about routing ground since it appears on metals 402 and 404. This provides an easier method of layout for the circuit designers since they do not have to be concerned about ground routing. Each ground is made by a metalized slot with the bottom oxide removed that contacts the substrate. Likewise sinkers, drains, and other power points are directly connected with the first two layers of the buried power buss. Since the buried power buss results in oxide isolation there is no need for isolation mask and the long isolation diffusion. Likewise there is no need to provide a sinker mask and diffusion since the sinker points are connected with the oxide isolated power buss.

The same is true for the drain of MosFets. If the epitaxial layer is on the order of 6 $\mu$m thick, or less; then one can drop the buried layer mask. The buried layer is deposited and diffused via a blanket implant. After epitaxial deposition and the remaining processes, the oxidized slots go completely through the epitaxial material and blanket buried layer and therefore provide oxide isolation from buried layer to buried layer, thus providing the free masking of the buried layer. Likewise, the Up Isolation mask can be dropped and its processing.

The buried power buss results in a very efficient heat transfer since at times the metal is making direct contact to silicon and at other times the metal makes contact to silicon via oxide. Heat transfer through silicon is 10 times better than through oxide and 200 times better than through air. For this reason there is reason to believe that the heat transfer resulting from utilization of this method is much better than the heat transfer provided by the copper damascene method.

Since the metal on the main current carrying busses is 7.5 $\mu$m thick and 5 $\mu$m wide, electromigration is eliminated or at least put off to very high currents. For any design that is already in use, this use of the slots and the added thickness of metal in accordance with the present invention will allow at least an order of magnitude of additional current prior to any electromigration issues.

If it is desired that the current carrying capability be doubled, double slots of 5 $\mu$m wide are made, with 3 $\mu$m of distance between them. This results in metal that is 10 $\mu$m wide and 7.5 $\mu$m of metal thick. If additional metal layers are to be added to this process, after the metal 406, this can be done. This requires an additional planarization step earlier in the process (after first metal layer). This allows for multi metal structures above the—metal layer described.

As before mentioned, FIG. 5 shows the slots as metalized. In addition FIG. 5 shows the figures with the P sections of the lateral PNP being formed by a heavy implant and drive, resulting in the lateral diffusion being only 0.5 of the diffusion depth. This leaves the emitters and collectors as shown in FIG. 5 with very little curvature remaining in the diffusion. In addition, the bottom is cut out of the diffusion by the slots where the biggest curvature had occurred. This results in fairly even distribution of the basewidth going from the top of the emitter and collectors to the bottom. In essence a form of spiked P diffusion into the N epitaxial has been achieved. With this structure there are two separate transistors since the one on the left is oxide isolated from the one on the right. This approach has the following significant advantages over a standard process:

1. Emitters and collectors are spike diffusions resulting in higher beta due to the controlled and equal distance from top to bottom, resulting in improved base width control over the total thickness of the emitter and collectors.

2. The curved bottoms of the diffusions are removed by the power buss slots, therefore eliminating one of the big reasons for inefficiency in the normal lateral PNP beta, thus improving the beta.

3. The base contact is a buried contact thereby reducing any leakage due to surface effects. This will result in higher beta due to reduced base leakage.

4. Using MOS techniques throughout the process to ensure low oxide charge and low surface recombination velocity results in reduced surface recombination and lower leakage issues.

5. Since the base contact may be a slot that goes down to the buried layer it results in a non-pinched base region and therefore low rb'.

6. Since the collectors are significantly reduced in area interfacing with the epitaxial this results in low Cc for a given current and power level in a PNP collector.

7. The emitter capacitance is reduced due to the elimination of most of the emitter edge area that has been eliminated.

8. All parameters of the lateral PNP are now improved beyond the normal device. There is higher beta due to controlled and equal distance of basewidth and truncation of areas that were very inefficient. The resistance of the emitter and the collector are reduced through direct contact with metal along their total "surface".

9. The emitter is shown as grounded but in applications like a low dropout regulator where the emitter is not grounded, the oxide would be left at the bottom of the slot. In addition, with an extra mask a special slot is made and metalized for the emitter that does not have oxide on the sides of this slot. Therefore the total metal makes contact to the emitter from top to bottom of the emitter and prevents debiasing of the emitter at very high currents. This is an advantage in all high power lateral PNPs in LDOs and other structures.

10. The buried power buss results in very low resistance in the ground and power busses to the PNP and low power drops.

11. The buried power buss results in high heat transfer. The lateral PNP made in this manner will have a significantly improved heat transfer per watt of power dissipated due to metal in slots that are in very close proximity to the active emitter and collectors.

12. Electromigration is essentially eliminated using the buried power buss with this PNP structure.

13. Utilizing this structure in low dropout regulators will result in being able to supply a superior product relative to achieving low drop out voltage for a given current and power level.

14. Higher $F_t$ and $F_{max}$ for the same given area than any standard approach used to date.

15. Although the slots are shown for a power lateral PNP the same approach can be used for low power lateral PNPs to improve the frequency response and improve beta at a given current level.

Second Embodiment: Using Buried Power Buss and Emitter and Collector Slots Processed Prior to Boron Deposition and Diffusion Using essentially the same process flow as discussed above, an improvement will be discussed whereby the PNP process is not carried out in the same place to effect an even better structure.

The process flow remains as standard up to the contact opening step, except the processing of the lateral PNP is skipped up to this point. The buried power buss slots are processed and the slots are oxidized. At this point there is a major departure.

Where the slots are not completely through the epitaxial material a mask is employed to provide for etching the oxides off the slots that were formed for the emitters and collectors of the lateral PNP. This is followed by a deposition of boron 502 shown in FIG. 6C which will be deposited along the total inner edge of the emitter and collector slots. This is followed by a diffusion drive which is much shorter and at a lower temperature than the standard process and forms Boron junctions along the inside periphery of the slots. This diffusion is done in a non-oxidizing process. This is followed by the metal depositions of metal 402, 404 and 406 as described in the approach above and the wafers are processed to completion. If a slight oxide is formed in these slots during the boron diffusion it should be dipped out with an oxide etch. If the boron is elemental boron it may need to receive a low temperature oxidation followed by a dip etch to remove the elemental boron and oxide and eliminate any contact resistance. If the application is such that the power buss slots go completely through the epitaxial material, the slots for the lateral PNP are processed separately using an extra masking. This is done immediately after the other slots are oxidized. Shallower slots are formed using this extra mask and are not oxidized. Therefore when metal is deposited as discussed it will contact the total emitter and collector periphery and depth.

An option to the PNP structure is to process the PNP slot so as to leave a dielectric, for example, oxide, in the bottom of the PNP emitter and collector slots prior to the boron doping. This produces the structures shown in FIG. 7B where there is no boron dopant diffused from the slot bottoms or metal contact to the slot bottoms. This structure reduces the substrate injection from the emitter which enhances the lateral PNP device. This process option of selectively leaving a dielectric on the slot bottom can be accomplished through various means, for example: once the PNP slots are clear of oxide in the above description, either by oxide etching or slot etching, a thin oxide (100–500 A) could be thermally grown or deposited by CVD techniques followed by the deposition of a silicon nitride layer of thickness 200 A to 1000 A. Following this with the removal of the silicon nitride on horizontal surfaces by an anisotropic etch to produce silicon nitride spacers on the slot walls. These silicon nitride spacers are then used to mask the emitter and collector slot walls from a second thermal oxidation, which grows sufficient oxide thickness (500 A–5000 A) on the slot bottoms to mask the boron dopant and to prevent metal contact after the removal of the side wall nitride and underlining oxide.

These processes result in metal in the buried power buss slots that are oxide isolated from all other elements except where the oxide is removed in the bottom of the slot to contact ground or to contact buried layer. At the same time the metal in the slots just formed for the emitters and collectors of the lateral PNP is making direct contact with the boron in these slots since these slots were not oxidized. This results in the ideal structure shown in FIG. 6C. This structure has the following characteristics and advantages over any other approach:

1. The emitters and collectors are self-aligned by means of the slots determining their location.

2. The emitters and collectors are spike like structures since they are determined by the edge of the slots and the shallow junctions protruding from them. This second embodiment has more ideal spike like diffusions than the first embodiment.

3. The basewidths are the same at the top of the structure near the surface; as well as for the full depth of the slots.

4. The concentration of the emitters and collectors are the same at the top of the structure as at the bottom of the structure, resulting in equal injection along the total edge of the emitter.

5. Since the junction depth is actually shallow and is only perceived to be the depth of the slots, injection is determined by a high concentration rather than the normally lighter doped deep diffused junctions at any depth.

6. Since the junction depth is actually shallow and is determined by the slot depth, the slots can be moved much closer to each other than the standard process. This results in a narrow basewidth from the top of the structure to the bottom of the structure.

7. Because of the narrow basewidth and high concentration of boron, the emitter efficiency is very high and the transport factor and collection efficiency is very high resulting in the beta and frequency being higher.

8. As a result of the advantages mentioned in 5, 6 and 7 above, the structure is smaller for a given current level.

Figure 7A:
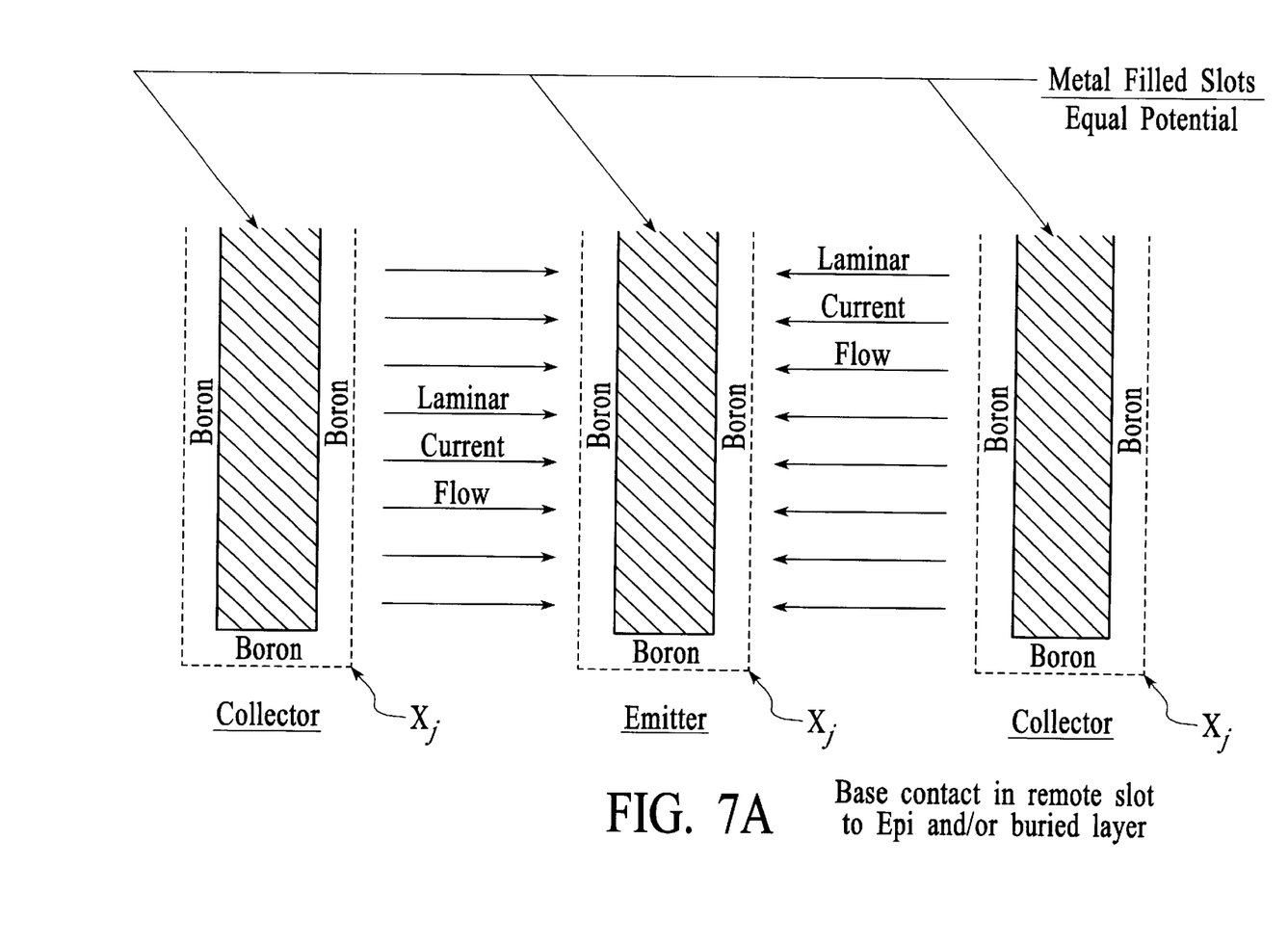
FIGS. 7A and 7B illustrate metal filled slots where boron was previously diffused to form P junctions around the total slots and demonstrates laminar flow of current from the emitter to the collectors.
Figure 7B:
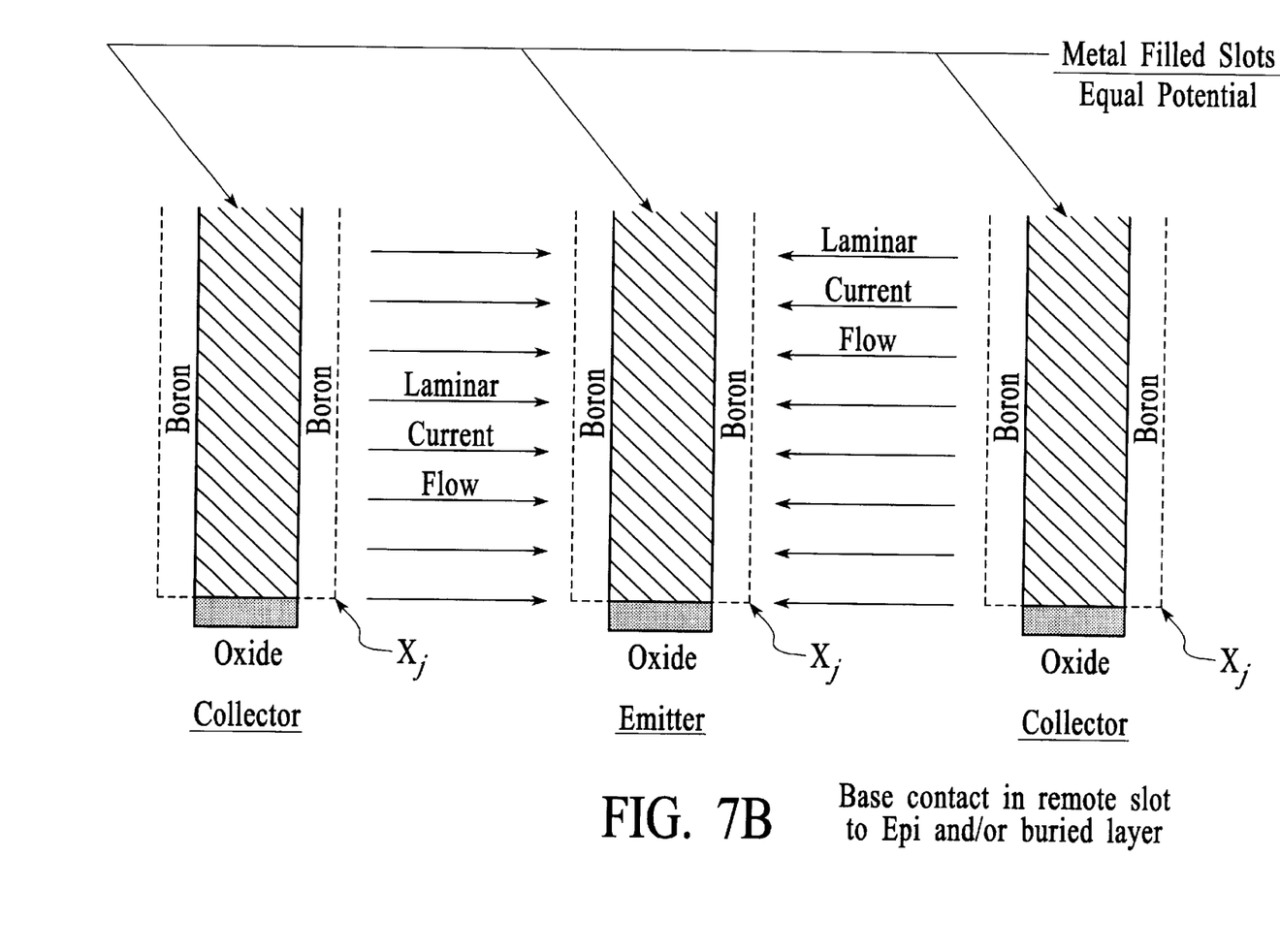

9. Debiasing of the emitter is eliminated since metal is thick in the slots and follows the contour of the emitter. The "folding of the metal in the slots reduces the sheet resistance significantly. This results in an equal potential emitter metal bar and current density being equal along the total emitter structure. Because the metal is making contact along the total emitter, current is in parallel rather than in series as it is in a structure with the metal contact at the top. This is a major advantage of this structure. Current flows in a laminar type condition from the emitters to the collectors as shown in FIG. 7A. This flow of current results in no debiasing of the emitter at high current, as is the case in all standard emitter structures at high currents. There is essentially no IR drop in the thickly metalized emitter slots.

10. As a result of the items indicated above, this structure results in high beta from low currents to higher currents and from low frequencies to higher frequencies than other structures. It is as close to an ideal lateral PNP as one has achieved to date.

11. An ideal emitter injects from its junction and a diffusion length back from this edge toward the metal. This being the case, the depth of the boron along the edge of the slot should be made at least one diffusion length deep. This would ensure injection from the total boron depth along the total periphery. To ensure ideal injection without back injected base current resulting due to interaction with the metal, it may be necessary to increase the depth of the Boron diffusion to provide two to four diffusion lengths. This is still a relatively shallow diffusion compared to the standard approach.

12. This device structure can be achieved without an added mask since the normal masking for the lateral PNP would be skipped and replaced as an "emitter/collector" slot mask as detailed previously.

Examples-Boron Diffused Slots

Figure 6A:
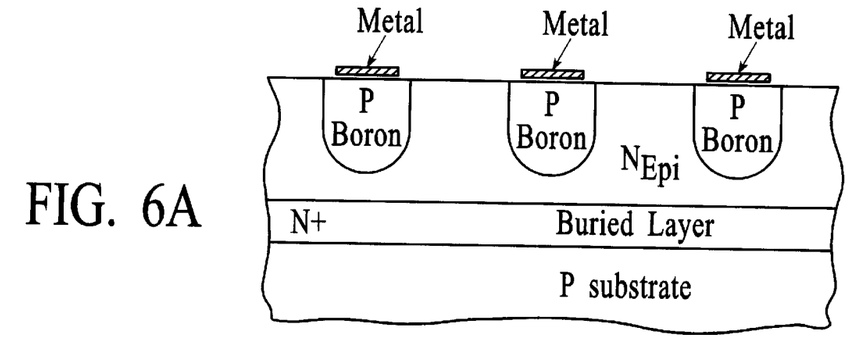
FIGS. 6A and 6B illustrate standard boron diffused after boron implant followed by slot formation and metal deposited in the slots of the emitters and collectors.
Figure 6B:
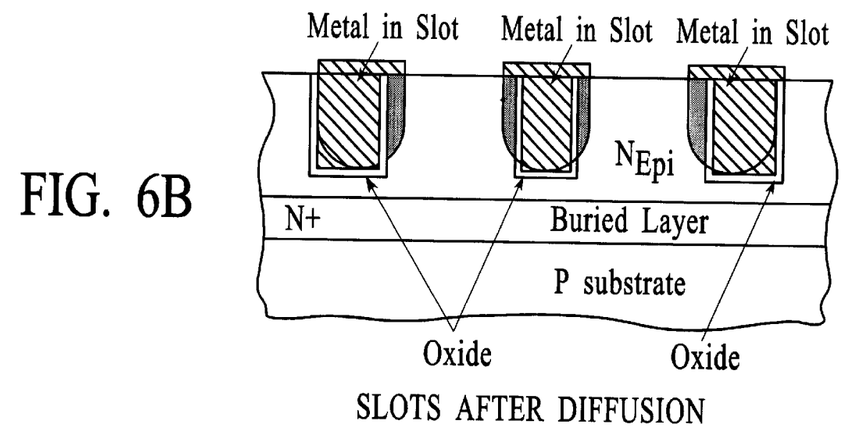

FIGS. 6A and 6B illustrates standard boron diffused after boron implant followed by slot formation and metal deposited in the slots of the emitters and collectors. If properly carried out, this process will result in the outer edges of the emitters and the inner edges of the collectors boron P+ plus (+) remaining as pseudo spike diffusions. This results in a more uniform injection and collection across a broad range of current. Metal in the slots results in much less debiasing than the standard approach. Beta is higher and flatter over a broader range of current.

Figure 6C:
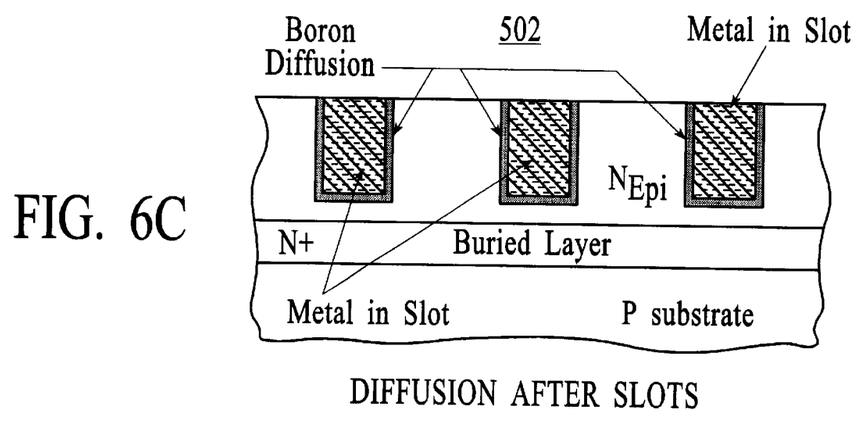
FIG. 6C illustrates slots formed first and followed by boron deposition and diffusion (shallow) and then filled with metal.

FIG. 6C illustrates slots formed first and followed by boron deposition and diffusion (shallow). This is followed by metal in the slots. Results in almost perfect spike type structures for lateral injection and collection because of the lack of slope to the diffusion. Debiasing eliminated due to metal filling the slots and presenting a low resistance with current being carried in parallel rather than series as is the standard approach. This approach results in higher beta and beta retention over a broader range of current. Debiasing is eliminated because of the profile of the metal extending along the total length of the boron diffusion as well as the thickness of this metal.

FIG. 7A illustrates metal filled slots where boron was previously diffused to form P junctions around the total slot's periphery-resulting in laminar current flow because of equal basewidth and thick metal in the slots with very little voltage drop resulting in an equal potential slot bar.

If P+ emitters and collectors for the lateral PNP are not put in until after the buried power buss slots have been put in and been oxidized, there is a very powerful advantage due to the resulting structure as shown in FIGS. 6C and 7A.

After oxidizing the buried power buss slots, slots would be masked and etched for the emitters and collectors of the lateral PNP. Boron would be deposited into these slots and driven slightly. They do not have to be driven far since the slot depth determines the depth of these emitters and collectors and the boron just follows the outline of the slots. After the slight drive of the boron, the metal is deposited in the buried power buss plus the emitters and collectors (that are not oxidized). Wafers are then processed to completion. What this now provides is the following:

Metal is in the buried power buss slots and is therefore oxide isolated from other elements. The emitters and collectors of the lateral PNP have boron along the whole surface of the slots with metal in their slots just like the buried power buss metal. The emitters and collectors are self aligned by means of using these slots as receptacles for the boron and metal. Boron is no longer following a diffusion profile, but is following the slot profile. This means boron is quite even along the whole surface (where surface is defined as the total slot surface) of the slots in a sharp profile, as well as the metal that is deposited in the slots from top to bottom. This means that debiasing is not only eliminated, but one achieves equal injection and collection and therefore beta along the whole profile of the emitters and collectors. The emitters and collectors look like a step function (abrupt junction with no curvature). All things being considered it gives an ideal injection and collection lateral PNP with heavy metal along the whole injecting and collecting fronts that ensures no debiasing and no drop off of beta at the normal current presently being experienced. Beta will drop off at a much higher current level than the present method. When this procedure is properly carried out, a higher beta is provided over this higher current range.

It is important to have the Boron diffusion depth to be greater than the carrier diffusion length away from the metal. This is to ensure proper injection without interference by the metal. Since metal is in the middle of the slots, injection will occur from the total diffusion depth on the edges of the slots. This may be achieved without an extra mask, since the mask used for defining the deep P type emitters and collectors is not used in the normal flow and is used for these "active" lateral PNP slots.

Examples-Various Epitaxial Thicknesses

One of the advantages of utilizing a system and method in accordance with the present invention is that the epitaxial layer can be of various thicknesses as appropriate. To describe this feature in more detail, refer now to the following discussion in conjunction with the accompanying figures.

Figure 8A:
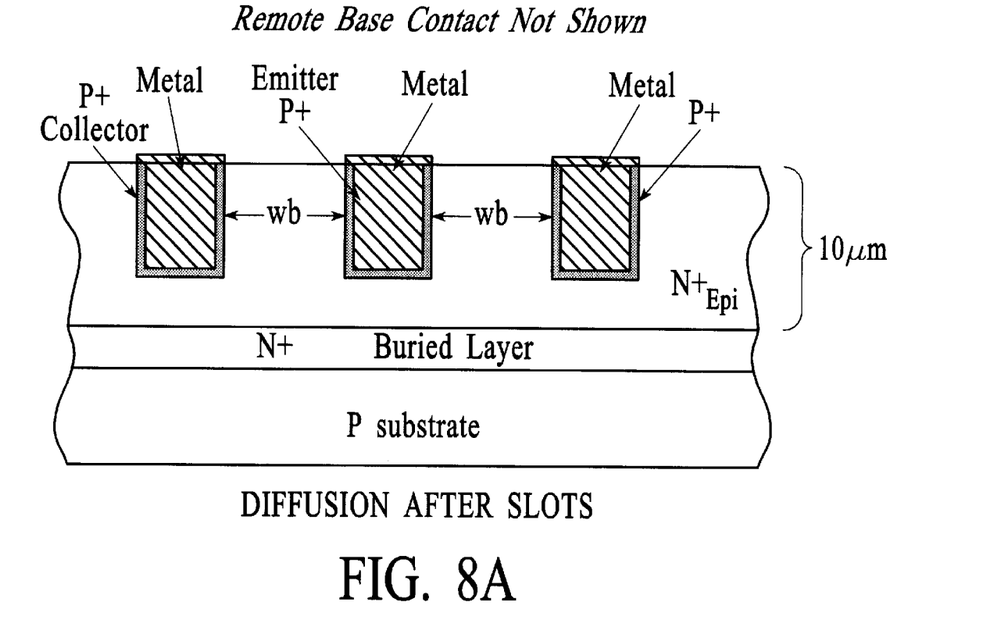
FIGS. 8A, 8B, 8C and 8D illustrate slots for various thickness of epitaxial material where the slots are formed before the P+ emitter and collector diffusions are done.

FIGS. 8A, 8B, 8C, and 8D illustrate slots for various thicknesses of epitaxial material. FIG. 8A illustrates 10 µm thick epitaxial material N type. The slots are 6 µm deep and whatever width is required for the given process. In this approach the slots are etched prior to the P+ doping of the lateral PNP emitters and collectors. If it is desired that the emitter be grounded there is a P+ buried layer that diffuses up and makes contact with the P+ that is on the edge of the slots. If the emitter is not to be grounded there is no buried P+. However, there may be occasion to have the collectors grounded or to form a ground at any remote point in the circuit. This can be accomplished using the approach just mentioned.

Figure 8B:
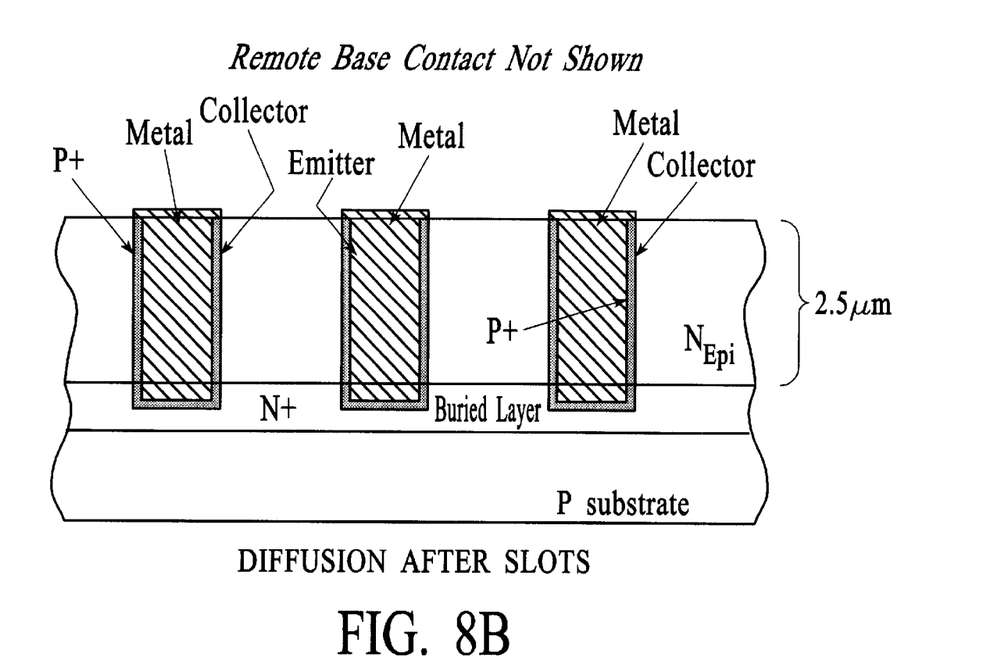
Figure 8C:
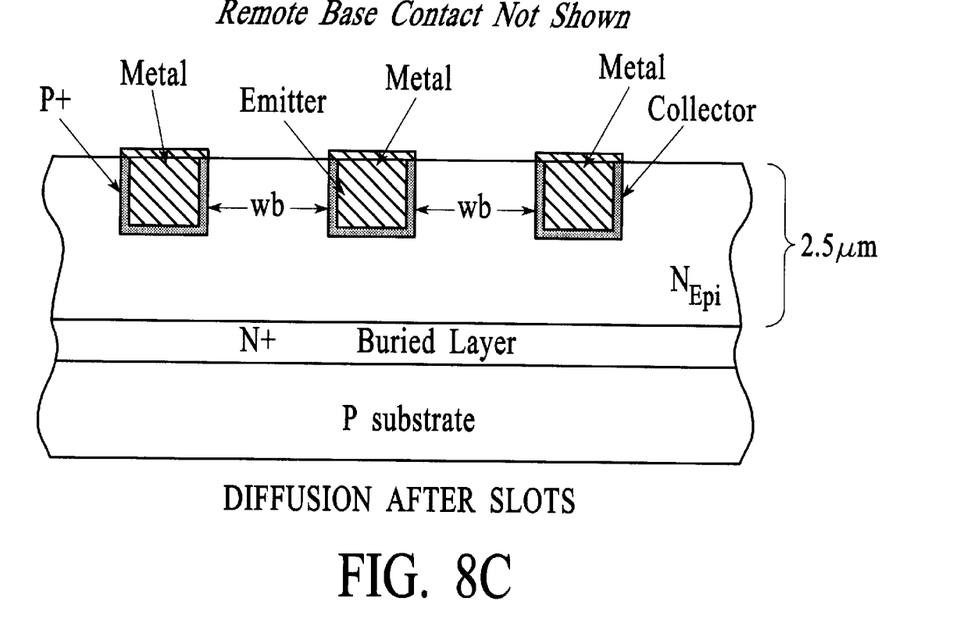

FIGS. 8B and 8C illustrate a 2.5 µm thick N epitaxial material. FIG. 8B illustrates 6 µm slots and has an N+ buried layer to keep the P+ that goes to the substrate from shorting the emitters to collectors. FIG. 8C illustrates a 2.5 µm epitaxial and the slots are only 1.5 µm deep. This will result in the slots being filled with one deposition of metal 1A and does not require a second deposition 1B. The device continues to use metal deposition 1C as the interconnect metal as well as contacting all of the slots. The total metal at the slot positions will be approximately 3.5 µm thick and 1 µm thick in the interconnects as an example.

Figure 8D:
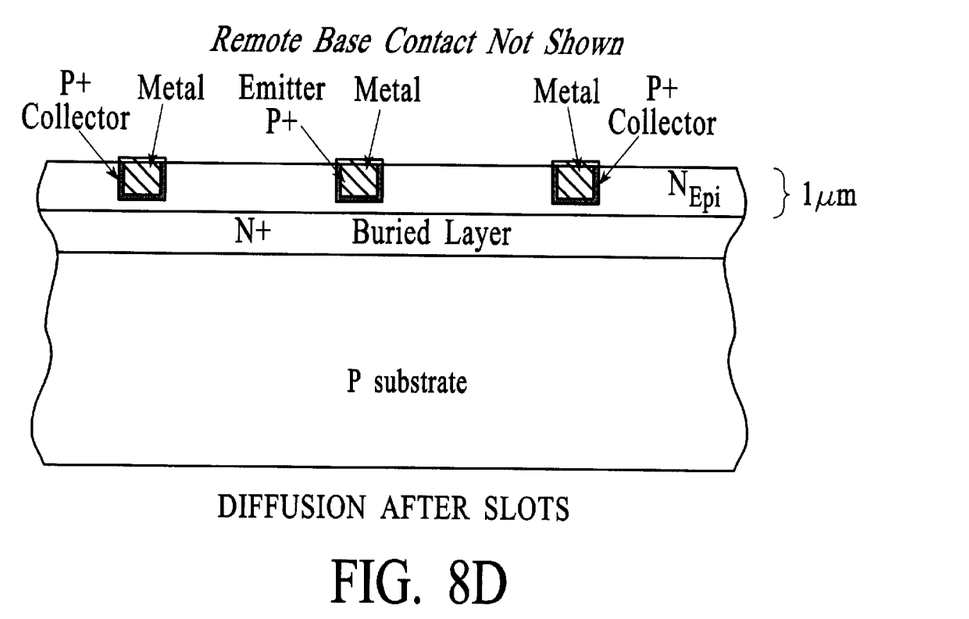

FIG. 8D illustrates a 1 µm thick epitaxial material with slots that are one half micron deep. If the slots are two microns wide and one micron of metal is deposited (for example), it will result in metal 1.5 µm thick in the slots due to the folding of the metal and 1 µm thick in the interconnects. As a result, the interconnects are easy to etch and include 1.5 µm metal in the slots for carrying high current.

Figure 9A:
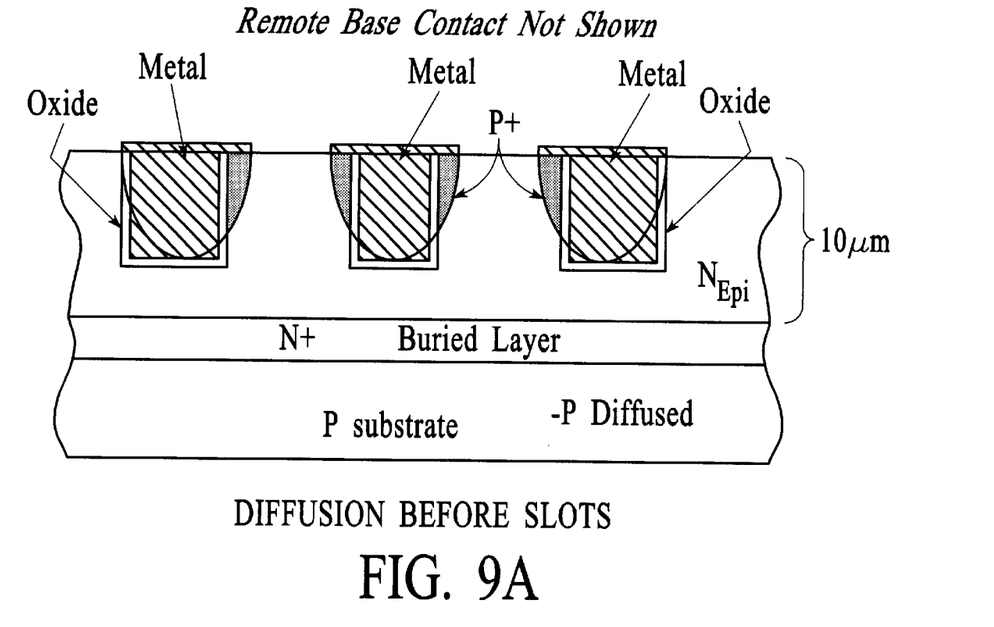
FIGS. 9A, 9B and 9C illustrate examples of different thickness (10 um, 5 um and 2.5 um thickness, respectively) of epitaxial material where the PNP P+ for emitters and collectors are formed prior to the slot etch.
Figure 9B:
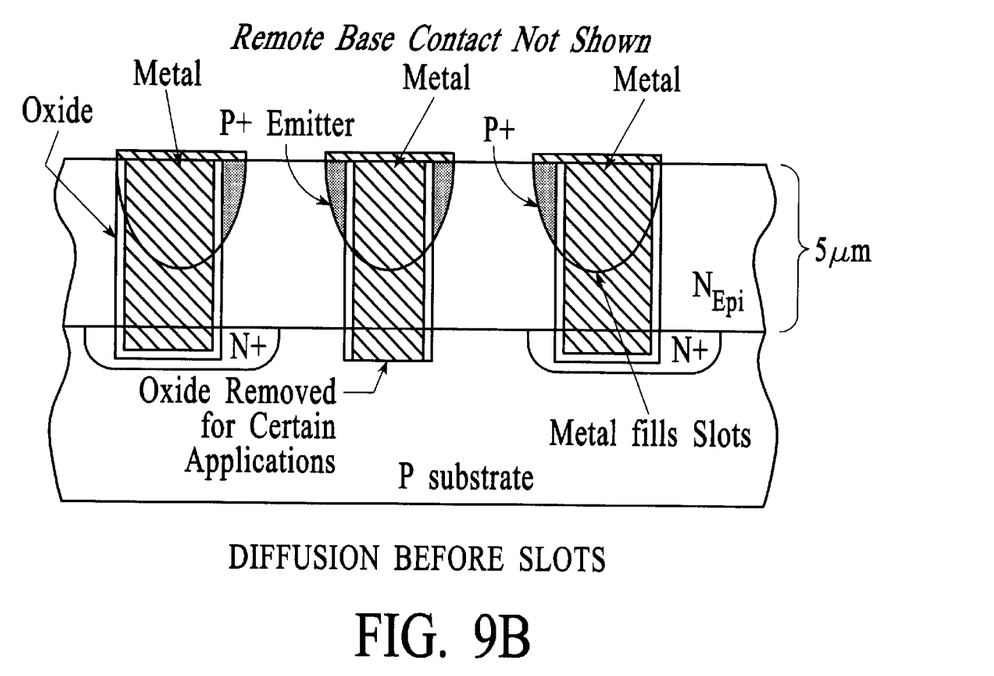
Figure 9C:
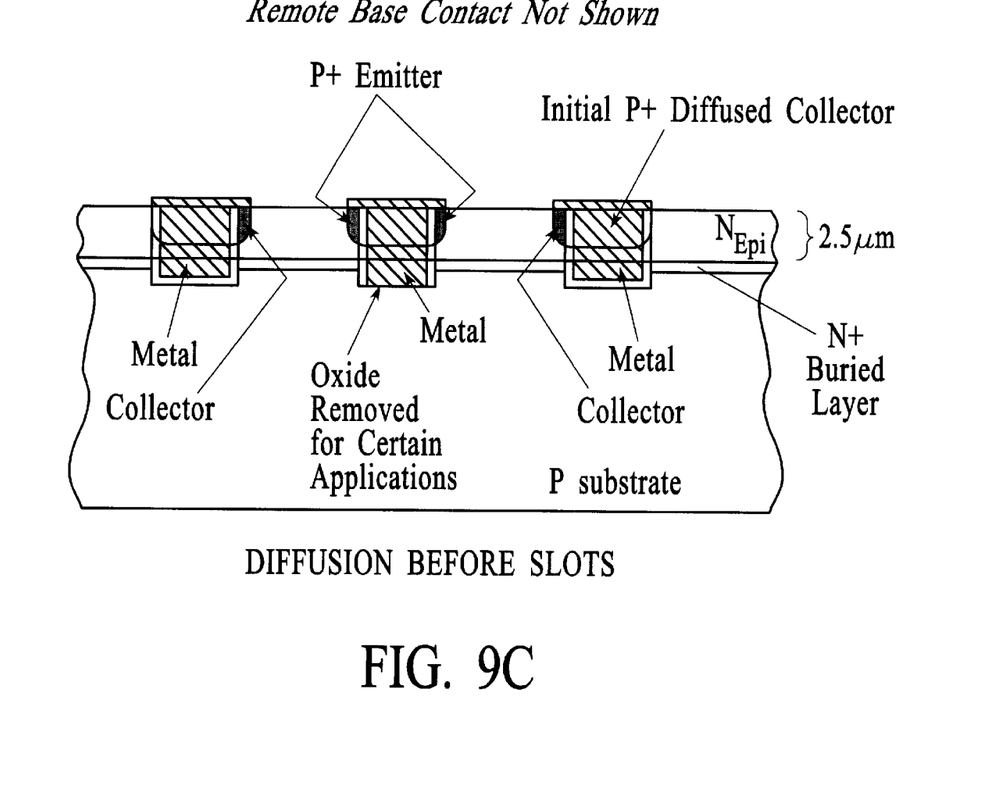

FIGS. 9A, 9B and 9C illustrate examples of different thicknesses (10 µm, 5 µm and 2.5 µm thickness, respectively) of epitaxial material where the PNP P+ for emitters and collectors are formed prior to the slot etch. The slot cuts through the emitter and leaves the outer edges to face the collectors. The slot cuts through the collectors in a way to only leave the inner edge of the collectors with P+ showing. The slot cuts look like P+ spikes of collectors facing P+ spikes of emitter on the outer edges of the emitter. This approach uses the standard process flow and puts the slots in when doing the buried power buss slots. This approach does not give the sharpness of "spike" P+ emitters and collectors as the approach where the slots are put in first and the P+ diffusions done for the emitter and collectors.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A power lateral PNP device comprising:

an epitaxial layer;

first and second collector regions embedded in the epitaxial layer;

an emitter between the first and second collector regions; each of the first, second collector regions and the emitter region including a slot, the slot including deposited boron on a surface thereof; and a metal provided in each of the slots.

2. The power lateral PNP device of claim 1 wherein the emitter and collector regions are spike diffusion resulting in higher voltages.

3. The power lateral PNP device of claim 2 wherein leakage is reduced based upon a buried power buss slot.

4. The power lateral PNP device of claim 3 wherein curved bottoms of diffusion are eliminated in first and second collector regions.

5. The power lateral PNP device of claim 4 wherein the emitter region capacitance is reduced based upon elimination of a significant amount of edge area.

6. The power lateral PNP device of claim 5 wherein the metalized slot has a high heat transfer.

7. The power lateral PNP device of claim 1 wherein frequency response is improved over a wide range of currents.

8. The power lateral PNP device of claim 1 wherein debiasing is minimized.

9. The power lateral PNP device of claim 1 wherein the slot in the emitter region provides for separate emitter structures.

10. The power lateral PNP device of claim 9 wherein the slot in the emitter region has no boron at the bottom.

* * * * *